Figure 1:
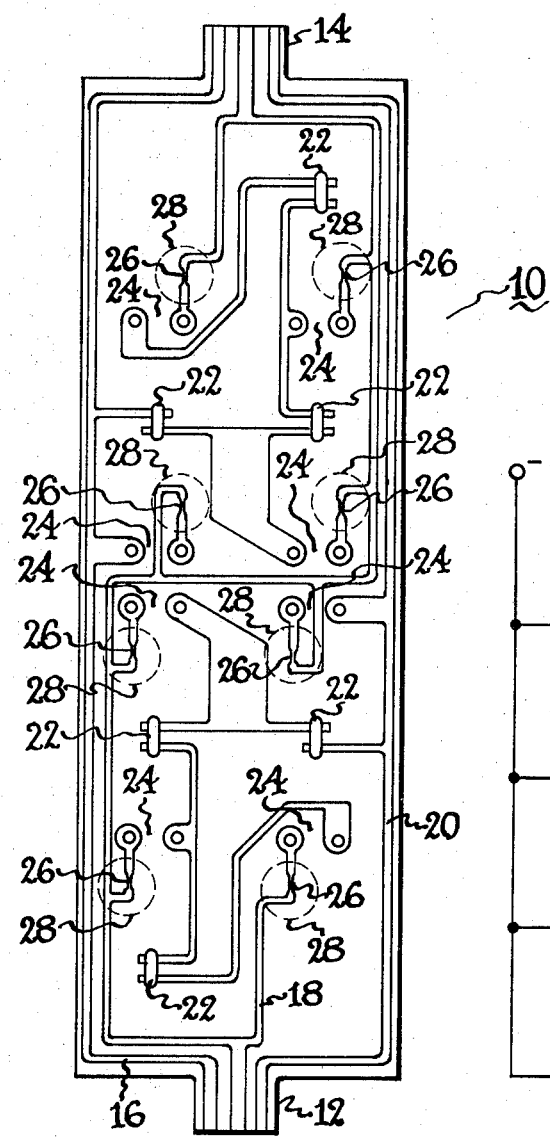
Figure 2:
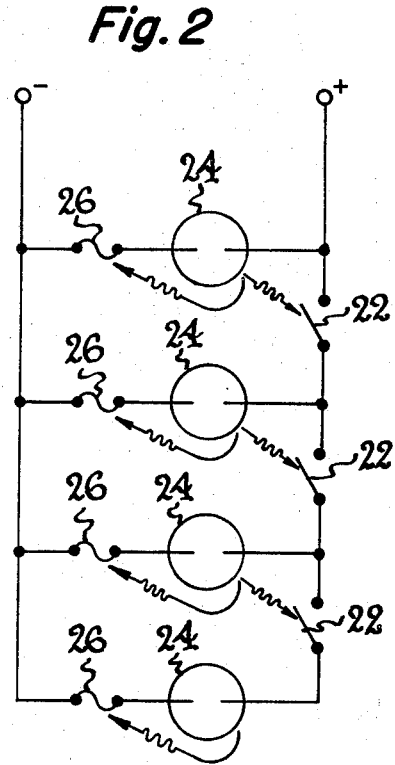

United States Patent [19]

Collins et al.

[11] 4,290,748

[45] Sep. 22, 1981

[54] PHOTOFLASH LAMP ARRAY CIRCUIT BOARD HAVING RADIATION SENSITIVE FUSE ELEMENTS

[75] Inventors: Edward J. Collins, Mentor-on-the-Lake, Ohio; William A. Lenkner, Neoga, Ill.

[73] Assignee: General Electric Company, Schenectady, N.Y.

[21] Appl. No.: 92,697

[22] Filed: Nov. 9, 1979

[51] Int. Cl.³ .................................................. F21K 5/00
[52] U.S. Cl. ...................................... 431/359; 362/13
[58] Field of Search ................ 431/359; 362/4, 6, 11, 362/13, 16

[56] References Cited

U.S. PATENT DOCUMENTS

| | | | |
|---|---|---|---|
| 3,443,875 | 5/1979 | Herrmann | 431/359 |
| 3,532,931 | 10/1970 | Cote et al. | 431/359 |
| 3,968,056 | 7/1976 | Bolon et al. | 252/514 |
| 3,988,647 | 10/1976 | Bolon et al. | 317/101 B |
| 4,017,728 | 4/1977 | Audesse et al. | 431/359 X |
| 4,087,233 | 5/1978 | Shaffer | 362/6 X |
| 4,097,220 | 6/1978 | Cote et al. | 431/359 |
| 4,128,858 | 12/1978 | Sterling et al. | 362/13 |
| 4,133,631 | 1/1979 | Collins et al. | 431/359 |
| 4,154,569 | 5/1979 | van Werkhoven | 91/357 |
| 4,182,607 | 1/1980 | Collins et al. | 431/359 |

*Primary Examiner*—Samuel Scott
*Assistant Examiner*—Randall L. Green
*Attorney, Agent, or Firm*—John F. McDevitt; Lawrence R. Kempton; Philip L. Schlamp

[57] ABSTRACT

Improved fuse elements used with the circuit board to provide more reliable sequential firing in a flash lamp array. The circuit board includes a lamp firing circuitry along with radiation switches connected in said circuitry and more reliable fuse elements cooperate with said radiation switches in the circuit operation. The improved fuse elements are constructed as an integral part of the lamp firing circuit pattern deposited on the circuit board at circuit locations wherein the underlying circuit board substrate has a thickness less than the substrate thickness elsewhere to enhance melting or thermal decomposition of the circuit board substrate.

10 Claims, 2 Drawing Figures

PHOTOFLASH LAMP ARRAY CIRCUIT BOARD HAVING RADIATION SENSITIVE FUSE ELEMENTS

BACKGROUND OF THE INVENTION

Radiation sensitive fuse elements for use with a circuit board to provide more reliable sequential firing in the flash lamp array are already known. For example, U.S. Pat. No. 4,133,631, assigned to the assignee of the present invention, describes a circuit board configuration which includes such fuse elements being deposited at circuit locations wherein the underlying substrate has a thickness less than the substrate thickness elsewhere to produce holes in the circuit board by melting or thermal decomposition when activated by radiation being emitted from adjacent flash lamps. Said fuse elements are deposited on the underlying circuit board substrate and comprise at least 20% or more of a radiation absorbent solid particulate such as carbon black mixed with conventional liquid adhesive which hardens to a solid at ordinary temperatures. When this fuse material composition is deposited directly on the circuit pattern and allowed to harden at locations on the circuit board that have been recessed to enhance localized melting or decomposition of the underlying substrate, the fuse actuation produces a hole through the entire composite medium. Interruption of the circuit path is obtained in this manner to the activating flash lamp which can be disposed in a branch circuit along with a fuse element and thereby disrupt electrical connection to the already fired flash lamp.

Another type known radiation-sensitive fuse element construction for use in the same general manner is described in U.S. Pat. No. 4,154,569. This type fuse element construction utilizes a strip-like element which overlies a reduced thickness area of the circuit board member and which can be constructed from a polymer film deposited on the circuit board substrate which is thereafter perforated to help isolate the absorbed thermal energy in said strip element for more reliable thermal decomposition of the entire fuse. The circuit board pattern on which said strip elements are deposited is said to be formed of metal, for example silver, nickel, tin, copper or other readily conducting material, for example graphite. The circuit board support for the electrical circuit is also said to be pigmented in order to improve the heat absorbing capacity of the overall construction and soluble dyes can also be incorporated with the thermoplastic synthetic resin composition of said dielectric support for this purpose. Additionally, a dye is recommended for incorporation in the polymer material forming the strip-like fuse element to further improve radiation absorption in the overall construction.

Still other issued U.S. Pat. Nos. 3,968,056 and 3,988,647, which are also assigned to the present assignee, describe a circuit board construction which can be used with a photoflash array wherein a particular type electrically conductive ink provides the circuit pattern. Specifically, said conductive ink comprises an organic resin matrix having sufficient particulated electrically conductive material dispersed therein to form point by point electrical contact when the deposited liquid ink is cured to the solid state. In a preferred embodiment, a liquid ink composition is radiation curable to provide a solid coating having a resistivity of less than 10 ohm-centimeters when cured. The particulated electrically conductive material providing the electrical conductivity in said circuit pattern can be selected from a particulated electrically conductive metal and/or a particulated electrically conductive metal containing material which can further contain up to approximately 15% by weight of said particulated electrically conductive material in flake-like form with an aspect ratio of diameter to thickness greater than 20. The content of particulated electrically conductive material in said preferred embodiment is at least about 40% and not more than about 90% by weight with said particulated electrically conductive material preferably being in the form of metal-coated glass spheres.

SUMMARY OF THE INVENTION

Lower intensity flash lamps are now being used for cost and energy saving considerations which create a need for fuse elements in the above type photoflash array that interrupt the circuit path reliably with a lesser amount of radiation being emitted by such flask lamps. Accordingly, it is a primary object of the present invention to provide an improved fuse element construction in a circuit board of this type having both radiation sensitive switching elements and radiation sensitive fuse elements as part of the circuit pattern for cooperation therebetween when the associated lamps are flashed. Another object of the present invention is to provide fuse means which more reliably interrupts the circuit path when exposed to radiation from a cooperating flash lamp to thermally melt or decompose the underlying substrate and create a hole or opening for permanent disruption of the electrical connection. In accordance with said objects, the present improvement is accomplished with a circuit board pattern comprising an organic resin matrix having particulated electrically conductive material and a radiation absorbing material dispersed therein with said circuit pattern further including radiation sensitive fuse elements located where said dielectric substrate of the underlying circuit board member has a reduced thickness relative to the remaining thickness of said dielectric substrate and with said fuse elements being formed by providing a more narrow width of said circuit pattern at the fuse locations than the remaining width of said circuit pattern. The preferred radiation absorbing material dispersed in the circuit pattern is an organic dye dissolved in the thermoplastic polymer material. As previously indicated, the particulated electrically conductive material incorporated in said circuit pattern comprises metal coated glass spheres and the particulated electrically conductive material can further contain up to 15% by weight of said particulated electrically conductive material being metal flakes.

The particular circuit pattern material employed in the present invention, which is fully described in the aforementioned U.S. Pat. Nos. 3,968,056 and 3,988,647 patents hence need only be illustrated herein, serves an important role in accomplishing more reliable interruption of the circuit path when the present fused elements forming part of said circuit pattern are actuated. Electrical conductivity in said circuit pattern is solely attributable to physical contact between the electrically conductive filler particles so that physical separation therebetween effectively interrupts the circuit path. It is thereby not required that the fuse element portions of said circuit pattern be completely decomposed to form an opening entirely across the width of the circuit pattern since a lesser physical separation such as multiple

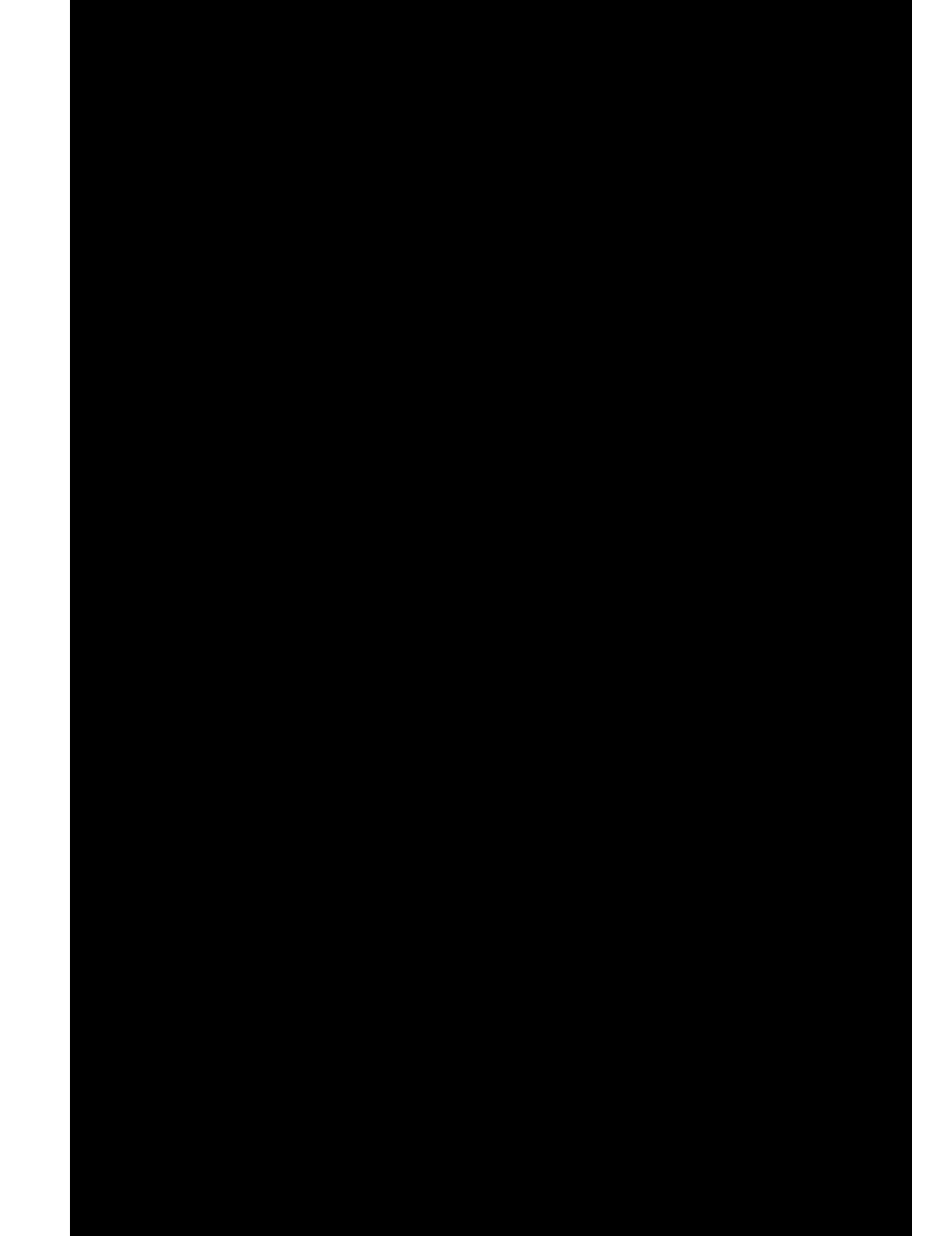

reduced thickness relative to the remaining thickness of the dielectric substrate of the circuit board member. Suitable fuse elements constructed in this manner are thereby modifications of the conductive ink compositions disclosed in the aforementioned 3,968,056 and 3,988,647 patents wherein a radiation absorbing material has been dispersed in the liquid ink to enhance thermal decomposition when actuated by radiation being emitted from the operatively associated flash lamps. Accordingly, an illustrative circuit ink composition can have in proportions by weight 0.5 parts hydrocarbon soluble dye, 32.5 parts of an ultraviolet curable polyester resin, and 67.0 parts silver coated glass spheres. When cured to the solid state at ordinary temperatures the more narrow width fuse element portions of said circuit board pattern effectively interrupts the circuit path when actuated by an adjoining flash lamp to produce physical separation of the incorporated electrically conductive filler particles. The indentations or reduced thickness portions of the circuit board members at fuse locations serve to reduce dissipation of the absorbed thermal and/or light energy when the fuse elements are actuated in this manner as well as enhance localized melting or decomposition of the circuit board member at the fuse locations causing an actual opening in said underlying substrate.

While preferred embodiments of the invention have been shown and described, various other embodiments and modifications thereof will become apparent to persons skilled in the art. For example, the desired circuit interruption can also be achieved in other firing circuit configurations such as one wherein the switch and fuse elements are both disposed appropriately in branch circuits with the flash lamps to provide the desired firing sequence. It is therefore intended to limit the present invention only by the scope of the following claims.

What we claim as new and desire to secure by Letters Patent of the United States is:

1. In a circuit board for a photoflash lamp array having a lamp firing circuit pattern deposited on a dielectric substrate and radiation sensitive switches connected in said circuitry for sequential firing of a plurality of flash lamps connected thereto, the improvement wherein said circuit pattern comprises an organic resin matrix having particulated electrically conductive material and a radiation absorbing material dispersed therein, said circuit pattern further including radiation sensitive fuse elements located at positions where the dielectric substrate has a reduced thickness relative to the remaining thickness of said dielectric substrate and with said fuse elements being formed by providing a more narrow width of said circuit pattern at the fuse locations than the remaining width of said circuit pattern, each of said flashlamps and radiation fuse elements being connected in branch circuits having the radiation sensitive switches connected therebetween.

2. A circuit board as in claim 1 wherein the radiation absorbing material dispersed in the circuit pattern is a dye.

3. A circuit board as in claim 1 wherein the particulated electrically conductive material comprises metal coated glass spheres.

4. A circuit board as in claim 3 wherein the particulated electrically conductive material further contains metal flakes.

5. A circuit board as in claim 1 wherein the radiation sensitive switches and the radiation sensitive fuse elements are located adjacent said flash lamps for simultaneous activation of an adjoining switch and fuse element.

6. In a circuit board for a photoflash array having a lamp firing circuit pattern deposited on a dielectric substrate and radiation sensitive switches connected in said circuitry for sequential firing of a plurality of flash lamps connected thereto, the improvement wherein said circuit pattern comprises radiation cured organic resin matrix having a particulated electrically conductive material selected from the group consisting of a particulated electrically conductive metal or a particulated electrically conductive metal containing material, including mixtures thereof, and with no more than about 15% by weight of said particulated electrically conductive material having an aspect ratio of diameter to thickness of a value greater than 20 being dispersed in said organic resin matrix along with a radiation absorbing material, said circuit pattern further including radiation sensitive fuse elements located at positions where the dielectric substrate has a reduced thickness relative to the remaining thickness of said dielectric substrate and with said fuse elements being formed by providing a more narrow width of said circuit pattern at the fuse locations than the remaining width of said circuit pattern, each of said flashlamps and radiation fuse elements being connected in branch circuits having the radiation sensitive switches connected therebetween.

7. A circuit board as in claim 6 wherein the radiation absorbing material dispersed in the circuit pattern is a dye.

8. A circuit board as in claim 6 in which at least 85% by weight of said particulated electrically conductive material is constituted by metal coated glass spheres.

9. A circuit board as in claim 6 in which at least about 40% and not more than about 90% by weight of said circuit pattern is said particulated electrically conductive material.

10. A circuit board as in claim 6 wherein the radiation sensitive switches and the radiation sensitive fuse elements are located adjacent said flash lamps for simultaneous activation of an adjoining switch and fuse element.

* * * * *